(12) United States Patent
Ye

(10) Patent No.: US 10,887,437 B2
(45) Date of Patent: Jan. 5, 2021

(54) DISPLAY PANEL

(71) Applicant: Wuhan China Star Optoelectronics Semiconductor Display Technology Co., Ltd., Wuhan (CN)

(72) Inventor: Jian Ye, Wuhan (CN)

(73) Assignee: Wuhan Chima Star Optoelectronics Semiconductor Display Technology Co., Ltd., Wuhan (CN)

( * ) Notice: Subject to any disclaimer, the term of this patent is extended or adjusted under 35 U.S.C. 154(b) by 0 days.

(21) Appl. No.: 16/462,947

(22) PCT Filed: Mar. 6, 2019

(86) PCT No.: PCT/CN2019/077144
§ 371 (c)(1),
(2) Date: May 22, 2019

(87) PCT Pub. No.: WO2020/098183
PCT Pub. Date: May 22, 2020

(65) Prior Publication Data
US 2020/0186631 A1 Jun. 11, 2020

(30) Foreign Application Priority Data

Nov. 14, 2018 (CN) .......................... 2018 1 1354019

(51) Int. Cl.
*H05K 5/00* (2006.01)
*H04M 1/02* (2006.01)
*G06F 1/16* (2006.01)
*H05K 1/18* (2006.01)

(52) U.S. Cl.
CPC ........ *H04M 1/0266* (2013.01); *G06F 1/1643* (2013.01); *H05K 1/189* (2013.01); *H05K 2201/10128* (2013.01)

(58) Field of Classification Search
CPC ...................................................... G06F 3/041
See application file for complete search history.

(56) References Cited

U.S. PATENT DOCUMENTS

| 4,330,684 A * | 5/1982 | Hayward | ............. H05K 1/0287 174/254 |
| 2013/0016047 A1* | 1/2013 | Masumoto | .......... G02F 1/13338 345/173 |

* cited by examiner

*Primary Examiner* — Jerry Wu

(57) ABSTRACT

A display panel includes a display area, a border area, a touch layer, and a touch trace. The border area includes a first trace area on opposite sides of the display area, a second trace area on another side of the display area, and a trace reserved area disposed inside an intersection of the first trace area and the second trace area. The touch layer includes a first electrode chain and a second electrode chain that are mutually intersected and insulated. The touch trace connecting the first electrode chain is arranged in the first trace area and the trace reserved area, and the second trace area only arranges the touch trace connecting the second electrode chain.

18 Claims, 2 Drawing Sheets

DISPLAY PANEL

RELATED APPLICATIONS

This application is a National Phase of PCT Patent Application No. PCT/CN2019/077144 having International filing date of Mar. 6, 2019, which claims the benefit of priority of Chinese Patent Application No. 201811354019.0 filed on Nov. 14, 2018. The contents of the above applications are all incorporated by reference as if fully set forth herein in their entirety.

FIELD AND BACKGROUND OF THE INVENTION

The present disclosure relates to the field of display technologies, and more particularly to a display panel.

BACKGROUND OF INVENTION

As display screens of mobile phones rapidly develop toward full screens, flexible active matrix organic light emitting diode (AMOLED) displays usually need to be matched with touch screens, and matching touch screens are also rapidly developed toward thin and narrow borders.

Generally, mutual capacitive touch screens with flexible AMOLED display panels include driving electrodes (TX) and sensing electrodes (RX). The TX and RX are positioned on a same side of a thin film substrate and connected by a bridge structure. Peripheral metal traces connecting the TX and RX are connected to a middle horizontal position of a lower border, are gathered together, and then then bonded and connected to a flexible circuit board. Because metal traces of TX and RX are gathered at a binding of the lower border, a width of a trace area is large, such that the lower border of an entire touch screen is wider, and this is not conducive to the development of narrow borders of display screens.

Therefore, the prior art has drawbacks and is in urgent need of improvement.

SUMMARY OF THE INVENTION

The present disclosure provides a display panel capable of effectively solving issues that a lower border of a touch screen is wider, thereby effectively increasing a screen ratio of the display panel.

To achieve the above objective, a technical solution provided by the present disclosure is as follows.

The present disclosure provides a display panel. The display panel includes a display area, a border area, a touch layer, a touch trace, and a flexible circuit board. The border area is disposed at a periphery of the display area. The border area includes a binding area and a trace area. The trace area includes a first trace area on opposite sides of the display area, a second trace area on another side of the display area, and a trace reserved area disposed at an intersection of the first trace area and the second trace area adjacent to a side of the display area. The second trace area is positioned between the display area and the binding area. The touch layer is disposed corresponding to the display area and includes a first electrode chain and a second electrode chain that are mutually intersected and insulated. The first electrode chain includes a plurality of touch electrodes connected through a bridge, and the second electrode chain includes a plurality of sensing electrodes connected to each other. The touch trace includes a first trace and a second trace. The first trace is disposed in the first trace area and is connected to the first electrode chain, and the second trace is disposed in the second trace area and is connected to the second electrode chain. The flexible circuit board includes a lead area disposed in a segment corresponding to the binding area. The lead area includes a first lead area at both ends of the lead area and a second lead area in a middle of the lead area. The first lead area is disposed at a preset tilt angle corresponding to the intersection of the first trace area and the second trace area, at least a portion of the first trace is electrically connected to the first lead area via the trace reserved area and is arranged in a curve or a fold line, and the second trace is electrically connected to the second lead area.

In an embodiment of the present disclosure, the first trace is connected to the first electrode chain, the second trace is connected to the second electrode chain, and the first trace is evenly arranged on both sides of the display area.

In an embodiment of the present disclosure, the first lead area is obliquely disposed toward a side of the trace reserved area.

In an embodiment of the present disclosure, a predetermined tilt angle of the first lead area ranges between 0 degree and 90 degrees.

In an embodiment of the present disclosure, a width between the first lead area and the touch layer is greater than or equal to a width of the first trace area.

In an embodiment of the present disclosure, a boundary of a portion of the touch layer adjacent to the trace reserved area matches a boundary of the trace reserved area, and a boundary line of the first electrode chain and/or the second electrode chain adjacent to the trace reserved area is an arc, a straight line, or a fold line.

In an embodiment of the present disclosure, a portion of the first trace positioned in the trace reserved area is parallel to the boundary line of the first electrode chain and/or the second electrode chain.

In an embodiment of the present disclosure, a boundary line of the first lead area adjacent to a side of the trace reserved area is same with a boundary line of the first electrode chain and/or the second electrode chain corresponding to the trace reserved area.

In an embodiment of the present disclosure, the flexible circuit board includes at least two second lead areas, and the second trace is electrically connected to the at least two second lead areas.

To achieve the above objective, the present disclosure further provides a display panel. The display panel includes a display area, a border area, a touch layer, a touch trace, and a flexible circuit board. The border area is disposed at a periphery of the display area. The border area includes a binding area and a trace area. The trace area includes a first trace area on opposite sides of the display area, a second trace area on another side of the display area, and a trace reserved area disposed at an intersection of the first trace area and the second trace area adjacent to a side of the display area. The second trace area is positioned between the display area and the binding area. The touch layer is disposed corresponding to the display area and includes a first electrode chain and a second electrode chain that are mutually intersected and insulated. The touch trace includes a first trace and a second trace. The first trace is disposed in the first trace area and is connected to the first electrode chain, and the second trace is disposed in the second trace area and is connected to the second electrode chain. The flexible circuit board includes a lead area disposed in a segment corresponding to the binding area. The lead area includes a first lead area at both ends of the lead area and a second lead area in a middle of the lead area. The first lead area is disposed at a preset tilt angle corresponding to the intersection of the first trace area and the second trace area, at least a portion of the first trace is electrically connected to the first lead area via the trace reserved area and is arranged in a curve or a fold line, and the second trace is electrically connected to the second lead area.

In an embodiment of the present disclosure, the first trace is connected to the first electrode chain, the second trace is connected to the second electrode chain, and the first trace is evenly arranged on both sides of the display area.

In an embodiment of the present disclosure, the first lead area is obliquely disposed toward a side of the trace reserved area.

In an embodiment of the present disclosure, a predetermined tilt angle of the first lead area ranges between 0 degree and 90 degrees.

In an embodiment of the present disclosure, a width between the first lead area and the touch layer is greater than or equal to a width of the first trace area.

In an embodiment of the present disclosure, a boundary of a portion of the touch layer adjacent to the trace reserved area matches a boundary of the trace reserved area, and a boundary line of the first electrode chain and/or the second electrode chain adjacent to the trace reserved area is an arc, a straight line, or a fold line.

In an embodiment of the present disclosure, a portion of the first trace positioned in the trace reserved area is parallel to the boundary line of the first electrode chain and/or the second electrode chain.

In an embodiment of the present disclosure, a boundary line of the first lead area adjacent to a side of the trace reserved area is same with a boundary line of the first electrode chain and/or the second electrode chain corresponding to the trace reserved area.

In an embodiment of the present disclosure, the flexible circuit board includes at least two second lead areas, and the second trace is electrically connected to the at least two second lead areas.

Beneficial effects of the embodiment of present disclosure are that, compared with current display panels, in the display panel of the embodiment of the present disclosure, a trace reserved area is disposed inside the intersection of the first trace area and the second trace area. That is, the electrode of the touch layer is cut off at the intersection to set the trace reserved area. The flexible circuit board adopts a segmented design and is disposed at an oblique position corresponding to the intersection of the first trace area and the second trace area, such that the first trace connecting the touch electrodes can realize a connection with the flexible circuit board without passing through the second trace area, thereby effectively reducing a width of a bottom border of the display panel and reaching a narrow border.

BRIEF DESCRIPTION OF THE SEVERAL VIEWS OF THE DRAWINGS

The accompanying figures to be used in the description of embodiments of the present disclosure or the prior art will be described in brief to more clearly illustrate the technical solutions of the embodiments or the prior art. The accompanying figures described below are only part of the embodiments of the present disclosure, from which figures those skilled in the art can derive further figures without making any inventive efforts.

DESCRIPTION OF SPECIFIC EMBODIMENTS OF THE INVENTION

Figure 1:
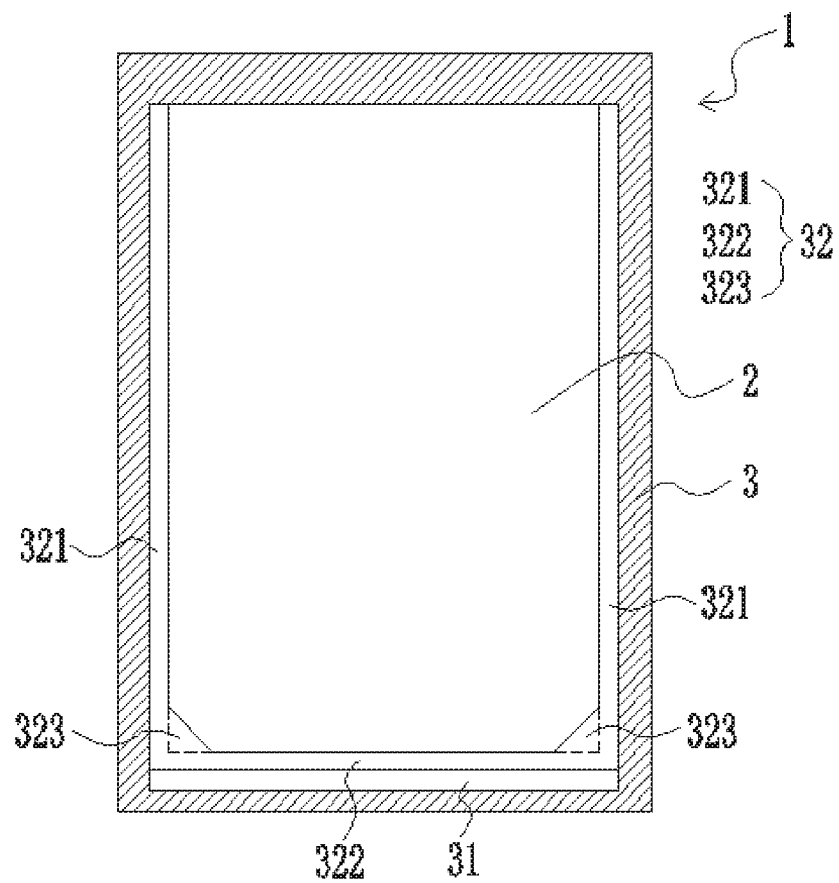
FIG. 1 is a schematic structural diagram of a display panel before being unbound according to an embodiment of the present disclosure.

The following description of the various embodiments is provided to illustrate the specific embodiments with reference to the accompanying drawings. Directional terms described by the present disclosure, such as top, bottom, front, back, left, right, inner, outer, side, etc., are only directions by referring to the accompanying drawings. Therefore, the directional terms used are for the purpose of illustration and understanding of the present disclosure and are not intended to be limiting of the present disclosure. In the drawings, units with similar structures are labeled with the same reference number.

The embodiment of the present disclosure is directed to solve a technical problem of a display panel of the prior art that a lower border of the display panel is wider, which is not conducive to the development of a narrow border. The embodiment can solve the defect.

Referring to FIG. 1, a schematic structural diagram of a display panel before being unbound according to an embodiment of the present disclosure is provided. A display panel 1 includes a display area 2 and a border area 3 disposed at a periphery of the display area 2. The border area 3 includes a binding area 31 and a trace area 32. The trace area 32 includes a first trace area 321 on opposite sides of the display area 2, a second trace area 322 on another side of the display area 2, and a trace reserved area 323 disposed at an intersection of the first trace area 321 and the second trace area 322 adjacent to a side of the display area 2. The second trace area 322 is positioned between the display area 2 and the binding area 31. In actual production, the binding area 31 may overlap with a partial area of the trace area 32 to properly utilize a space of the border area 3 as long as a trace is not affected. In addition, for convenience of illustration, the trace reserved area 323 is separated from the first trace area 321 and the second trace area 322 for distinction. In actual production, the trace reserved area 323 is in communication with the first trace area 321 and the second trace area 322.

Figure 2:
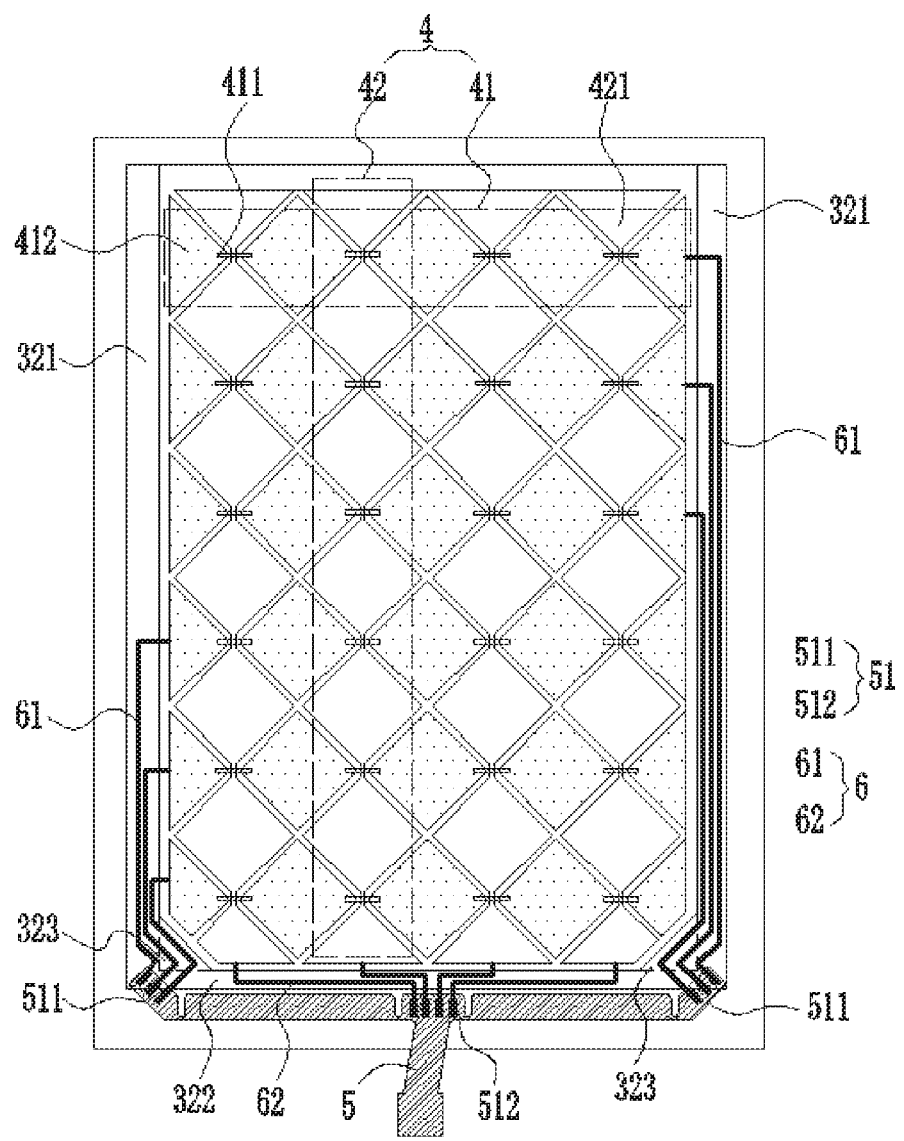
FIG. 2 is a schematic structural diagram of a display panel after being bound according to an embodiment of the present disclosure.

Combined with FIG. 2, a schematic structural diagram of a display panel after being bound according to an embodiment of the present disclosure is provided. The display panel includes a thin film transistor layer (not labeled), a pixel unit layer (not labeled), and other conventional film layers such as a touch layer 4. A touch mode of the display panel may be an in-plane touch or an external touch. This embodiment is described by taking the touch layer 4 as a mutual capacitive touch as an example and is not limited thereto.

The touch layer 4 is disposed corresponding to the display area 2 and includes a first electrode chain 41 and a second electrode chain 42 that are mutually intersected and insulated. The first electrode chain 41 is disconnected at a position crossing the second electrode chain 42 and electrically connected to a plurality of touch electrodes 412 through a bridge 411. The second electrode chain 42 includes a plurality of sensing electrodes 421 connected to each other. A capacitance is formed between the touch electrodes 412 and the sensing electrodes 421 to implement a touch function.

A touch trace 6 connecting the touch layer 4 and a flexible circuit board 5 is disposed in the trace area 32 of the border area 3. The touch trace 6 includes a first trace 61 and a second trace 62. The first trace 61 is disposed in the first trace area 321 and is connected to the first electrode chain 41, and the second trace 62 is disposed in the second trace area 322 and is connected to the second electrode chain 42. The first trace 61 is connected to the first electrode chain 41, and the second trace 62 is connected to the second electrode chain 42.

In an embodiment, the first trace 61 is evenly arranged in the first trace area 321 on both sides of the display area 2.

The flexible circuit board 5 is bound to the display panel corresponding to the binding area 31. The flexible circuit board 5 is in a segmented design and includes a lead area 51 provided with leads. The lead area 51 includes a first lead area 511 at both ends of the lead area 51 and a second lead area 512 in a middle of the lead area 51. The first lead area 511 is disposed at a preset tilt angle corresponding to the intersection of the first trace area 321 and the second trace area 322, and the first lead area 511 is obliquely disposed toward a side of the trace reserved area 323. The second lead area 512 and the second trace area 322 are horizontally disposed. That is, the lead area 51 is curved or bent toward a side of the display area 2. The first trace 61 is electrically connected to the first lead area 511 along the first trace area 321 via the trace reserved area 323, and the second trace 62 is disposed along the second trace area 322 and electrically connected to the second lead area 512. Because the first trace 61 connecting the first electrode chain 41 does not pass through the second trace area 322, a connection with the flexible circuit board 5 can be realized, thereby greatly reducing a width of a lower border of the display panel and reaching a narrow border.

In an embodiment, a predetermined tilt angle of the first lead area 511 ranges between 0 degree and 90 degrees. That is, the first lead area 511 and the second lead area 512 may be positioned on a same horizontal line. Alternatively, the first lead area 511 is away from an end of the second lead area 512 toward a side of the display area, for example, the predetermined tilt angle is 30°, 45°, or 60°.

During a preparation of the touch layer 4, at least a portion of the touch layer 4 corresponding to two corners of the second trace area 322 is cut off to form the trace reserved area 323. That is, the touch electrodes 412 and/or the sensing electrodes 421 corresponding to the intersection of the first trace area 321 and the second trace area 322 are partially cut off to form the trace reserved area 323. Alternatively, the touch electrodes 412 and/or the sensing electrodes 421 are designed to avoid the trace reserved area 323.

A boundary of a portion of the touch layer 4 adjacent to the trace reserved area 323 matches a boundary of the trace reserved area 323. A boundary line of the first electrode chain 41 and/or the second electrode chain 42 adjacent to the trace reserved area 323 is an arc, a straight line, a fold line, or combinations thereof.

In an embodiment, a width between the first lead area 511 and the touch layer 4 is greater than or equal to a width of the first trace area 321. That is, the first trace 61 may be completely disposed in the trace reserved area 323 to be connected to the first lead area 511. Alternatively, a portion of the first trace 61 is disposed in the trace reserved area 323, and another portion of the first trace 61 is directly connected to the first lead area 511 in the first trace area 321.

A portion of the first trace 61 positioned in the trace reserved area 323 is parallel to the boundary line of the first electrode chain 41 and/or the second electrode chain 42.

That is, when the first trace 61 passes through the trace reserved area 323, the first trace 61 may be arranged along the boundary line of the first electrode chain 41 or the second electrode chain 42, for example, the first trace 61 may be arranged in a straight line, curve, or a fold line.

In an embodiment, a boundary line of the first lead area 511 adjacent to a side of the trace reserved area 323 is same with a boundary line of the first electrode chain 41 and/or the second electrode chain 42 corresponding to the trace reserved area 323.

In an embodiment, the flexible circuit board 5 includes at least two second lead areas 512, and the second trace 62 is electrically connected to the at least two second lead areas 512. Because there are multiple second lead areas 512, a space occupied by the second traces 62 that are gathered together can be reduced, and therefore, a narrow border can be further realized.

In the display panel of the embodiment of the present disclosure, a trace reserved area is disposed inside the intersection of the first trace area and the second trace area. That is, the electrode of the touch layer is cut off at the intersection to set the trace reserved area. The flexible circuit board adopts a segmented design and is disposed at an oblique position corresponding to the intersection of the first trace area and the second trace area, such that the first trace connecting the touch electrodes can realize a connection with the flexible circuit board without passing through the second trace area, thereby effectively reducing a width of a bottom border of the display panel and reaching a narrow border.

In the above, although the present disclosure has been disclosed in the above preferred embodiments, the preferred embodiments are not intended to limit the present disclosure, and those skilled in the art can make various modifications and refinements without departing from the spirit and scope of the present disclosure. The protected scope of the present disclosure is therefore defined by the scope of the claims.

What is claimed is:

1. A display panel, comprising:
a display area; a border area disposed at a periphery of the display area, wherein the border area comprises a binding area and a trace area, the trace area comprises a first trace area on opposite sides of the display area, a second trace area on another side of the display area, and a trace reserved area disposed at an intersection of the first trace area and the second trace area adjacent to a side of the display area, and the second trace area is positioned between the display area and the binding area; a touch layer disposed corresponding to the display area and comprising a first electrode chain and a second electrode chain that are mutually intersected and insulated, wherein the first electrode chain comprises a plurality of touch electrodes connected through a bridge, and the second electrode chain comprises a plurality of sensing electrodes connected to each other; a touch trace comprising a first trace and a second trace, wherein the first trace is disposed in the first trace area and is connected to the first electrode chain, and the second trace is disposed in the second trace area and is connected to the second electrode chain; and a flexible circuit board comprising a lead area disposed in a segment corresponding to the binding area, wherein the lead area comprises a first lead area at both ends of the lead area and a second lead area in a middle of the lead area; wherein the first lead area is disposed at a preset tilt angle corresponding to the intersection of the first trace area and the second trace area, at least a portion of the first trace is electrically connected to the first lead area via the trace reserved area and is arranged in a line curved or folded toward the second trace, and the second trace is electrically connected to the second lead area, and the first trace connecting the first electrode chain is connected to the flexible circuit board without passing through the second trace area.

2. The display panel according to claim 1, wherein the first trace is evenly arranged on both sides of the display area.

3. The display panel according to claim 1, wherein the first lead area is obliquely disposed toward a side of the trace reserved area.

4. The display panel according to claim 3, wherein a predetermined tilt angle of the first lead area ranges between 0 degree and 90 degrees.

5. The display panel according to claim 3, wherein a width between the first lead area and the touch layer is greater than or equal to a width of the first trace area.

6. The display panel according to claim 1, wherein a boundary of a portion of the touch layer adjacent to the trace reserved area matches a boundary of the trace reserved area, and a boundary line of the first electrode chain and/or the second electrode chain adjacent to the trace reserved area is an arc, a straight line, or a fold line.

7. The display panel according to claim 6, wherein a portion of the first trace positioned in the trace reserved area is parallel to the boundary line of the first electrode chain and/or the second electrode chain.

8. The display panel according to claim 7, wherein a boundary line of the first lead area adjacent to a side of the trace reserved area is same with a boundary line of the first electrode chain and/or the second electrode chain corresponding to the trace reserved area.

9. The display panel according to claim 1, wherein the flexible circuit board comprises at least two second lead areas, and the second trace is electrically connected to the at least two second lead areas.

10. A display panel, comprising:
a display area; a border area disposed at a periphery of the display area, wherein the border area comprises a binding area and a trace area, the trace area comprises a first trace area on opposite sides of the display area, a second trace area on another side of the display area, and a trace reserved area disposed at an intersection of the first trace area and the second trace area adjacent to a side of the display area, and the second trace area is positioned between the display area and the binding area; a touch layer disposed corresponding to the display area and comprising a first electrode chain and a second electrode chain that are mutually intersected and insulated; a touch trace comprising a first trace and a second trace, wherein the first trace is disposed in the first trace area and is connected to the first electrode chain, and the second trace is disposed in the second trace area and is connected to the second electrode chain; and a flexible circuit board comprising a lead area disposed in a segment corresponding to the binding area, wherein the lead area comprises a first lead area at both ends of the lead area and a second lead area in a middle of the lead area; wherein the first lead area is disposed at a preset tilt angle corresponding to the intersection of the first trace area and the second trace area, at least a portion of the first trace is electrically connected to the first lead area via the trace reserved area and is arranged in a line curved or folded toward the second trace, and the second trace is electrically connected to the second lead area, and the first trace connecting the first electrode chain is connected to the flexible circuit board without passing through the second trace area.

11. The display panel according to claim 10, wherein the first trace is evenly arranged on both sides of the display area.

12. The display panel according to claim 10, wherein the first lead area is obliquely disposed toward a side of the trace reserved area.

13. The display panel according to claim 12, wherein a predetermined tilt angle of the first lead area ranges between 0 degree and 90 degrees.

14. The display panel according to claim 12, wherein a width between the first lead area and the touch layer is greater than or equal to a width of the first trace area.

15. The display panel according to claim 10, wherein a boundary of a portion of the touch layer adjacent to the trace reserved area matches a boundary of the trace reserved area, and a boundary line of the first electrode chain and/or the second electrode chain adjacent to the trace reserved area is an arc, a straight line, or a fold line.

16. The display panel according to claim 15, wherein a portion of the first trace positioned in the trace reserved area is parallel to the boundary line of the first electrode chain and/or the second electrode chain.

17. The display panel according to claim 16, wherein a boundary line of the first lead area adjacent to a side of the trace reserved area is same with a boundary line of the first electrode chain and/or the second electrode chain corresponding to the trace reserved area.

18. The display panel according to claim 10, wherein the flexible circuit board comprises at least two second lead areas, and the second trace is electrically connected to the at least two second lead areas.

\* \* \* \* \*

UNITED STATES PATENT AND TRADEMARK OFFICE
CERTIFICATE OF CORRECTION

PATENT NO. : 10,887,437 B2
APPLICATION NO. : 16/462947
DATED : January 5, 2021
INVENTOR(S) : Jian Ye Page 1 of 1

It is certified that error appears in the above-identified patent and that said Letters Patent is hereby corrected as shown below:

On the Title Page

Item (73) Assignee: "Wuhan Chima Star Optoelectronics Semiconductor Display Technology Co., Ltd." should be changed to -- Wuhan China Star Optoelectronics Semiconductor Display Technology Co., Ltd. --

Item (30) Foreign Application Priority Data: "201811354019" should be changed to -- 201811354019.0 --

Signed and Sealed this
Twenty-seventh Day of April, 2021

Drew Hirshfeld
*Performing the Functions and Duties of the*
*Under Secretary of Commerce for Intellectual Property and*
*Director of the United States Patent and Trademark Office*